United States Patent [19]

D'Souza

[11] Patent Number: 5,566,120

[45] Date of Patent: Oct. 15, 1996

[54] APPARATUS AND METHOD FOR CONTROLLING TRANSISTOR CURRENT LEAKAGE

[75] Inventor: Godfrey P. D'Souza, San Jose, Calif.

[73] Assignee: Sun Microsystems, Inc., Mountain View, Calif.

[21] Appl. No.: 545,073

[22] Filed: Oct. 19, 1995

[51] Int. Cl.$^6$ ........................................... G11C 8/00
[52] U.S. Cl. ........................ 365/227; 365/230.06
[58] Field of Search .............................. 365/227, 230.06, 365/189.08, 203

[56] References Cited

U.S. PATENT DOCUMENTS 5,235,548  8/1993  Kurkowski ............................. 365/227

Primary Examiner—David C. Nelms
Assistant Examiner—Trong Phan
Attorney, Agent, or Firm—Phil J. McKay

[57] ABSTRACT

A circuit for reducing current leakage in a logic circuit such as a write driver circuit in a memory array is disclosed. The current leakage reducing circuit includes a data line configured to be set to a predetermined voltage, a data drive circuit, and an enable circuit. The enable circuit is coupled to the data line and the data drive circuit, and is configured to enable the data line to accept a data value from the data drive circuit. The invention also includes a current leakage prevention circuit, coupled to the enable circuit, and configured to substantially reduce leakage from the data line through the enable circuit when the enable circuit is not enabled.

25 Claims, 3 Drawing Sheets

APPARATUS AND METHOD FOR CONTROLLING TRANSISTOR CURRENT LEAKAGE

BACKGROUND OF THE INVENTION

1. Field of the Invention

This invention relates to the field of logic design, and more particularly, to a logic design and method for reducing leakage current in logic circuits using field-effect transistors.

2. Background

Referring to FIG. 1, an SRAM memory array is shown. The memory array 10 includes a plurality of memory cells 12 arranged in (n) rows and (m) columns, a row decoder 14, a plurality of word lines 16(l) through 16(n) corresponding to each of the (n) rows in the array, a column decoder 18, and (m) differential bit line pairs BL and $\overline{BL}$ corresponding to each of the (m) columns. Each pair of differential bit lines BL and $\overline{BL}$ includes a precharge circuit 20(l) through 20(m) and a write driver circuit 22(l) through 22(m) respectively. Each write enable circuit 22(l) through 22(m) receives a write enable input signal 26(l) through 26(m) from the column decoder 18 respectively.

During a write operation, the precharge circuits 20 precharge the differential bit lines BL and $\overline{BL}$ for each of the (m) columns of the memory array 10. The row decoder 14 then selects a row in response to a row select address and the column decoder 18 selects a column in response to a column select address. The output of the column decoder 18 activates the write driver circuit 22 corresponding to the selected column. Consequently, the write driver circuit 22 causes the corresponding differential bit lines BL and $\overline{BL}$ to move in accordance with the data input signal provided at the data signal input 24 of the corresponding write driver circuit 22. For example in a memory array where the precharge is high, if the data input signal received at the data input 24 is high, the bit line BL discharges low and $\overline{BL}$ remains at the precharge voltage. If the data input signal is low, the bit line BL remains at the precharge level and $\overline{BL}$ discharges low. The memory cell 12 at the intersection of the selected row and column then stores the data on the moved differential bit lines BL and $\overline{BL}$. When the word line 16 is deactivated signalling the end of the write operation, the memory cell 12 stores the data indefinitely until another access operation of the memory cell 12 occurs. The above example shows how a binary data value is stored in a single memory cell 12 of a selected row. With different embodiments, the column decoder 18 may activate a plurality of write driver circuits 22 in response to a selected address. In response thereto, a plurality of data input signals 24 may be written into the plurality of memory cells 12 along the selected row.

Referring to FIG. 2, a prior art logic diagram of a write driver circuit 22 is shown. The write driver circuit 22 includes a data input 24 for receiving the data input signal, an enable input 26 for receiving the write enable signal, write line pass transistors 30 and 32, and inverters 34, 36, and 38. The enable input 26 is coupled to the gates of transistors 30 and 32. The source of the transistor 30 is coupled to the output of inverter 34 and the drain is coupled to the bit line BL. The input of inverter 34 is coupled receive the data input signal provided at the data input 24. The source of the transistor 32 is coupled to the output of inverter 38 and the drain is coupled to the bit line $\overline{BL}$. The input of inverter 38 is coupled to the output of inverter 36 and the input of inverter 36 is coupled to receive the data input signal provided at the data input 24.

The write driver circuit 22 has two states, inactive and write. During the inactive state, the write enable input 26 is low, causing the transistors 30 and 32 to be off. The voltage level of the differential bit lines BL and $\overline{BL}$ is therefore independent of the value of the data input signal because they are not coupled to the output of inverters 34 and 38 respectively. Conversely, during the write state, the bit lines BL and $\overline{BL}$ are first precharged. The write enable signal 26 then transitions high causing the transistors 30 and 32 to turn on, coupling the bit line BL to the output of inverter 34 and the bit line $\overline{BL}$ to the output of inverter 38. If the signal at the data input 24 is high, the output of inverter 34 is low, causing the bit line BL to be pulled low through the inverter 34. On the other hand, bit line $\overline{BL}$ remains high because the output of inverter 38 remains high when the signal at the data input 24 is high. The complement of the above applies when the data input signal is low.

Recently, complementary metal oxide semiconductor field-effect transistors (CMOS) logic has seen ever increasing use in digital systems. As MOSFET technology has evolved, individual MOSFET's have become steadily smaller, i.e., with narrower features. This has allowed more and more MOSFET's to be integrated together in one integrated circuit (IC), as well as to allow the requisite power supply voltage (VDD) to become smaller. Benefits of the former include reduced size and weight and increased operating frequencies, while benefits of the latter include reduced power consumption. However, operating MOSFET's at today's low power supply voltages has the undesirable effect of lowering MOSFET current which reduces the maximum operating frequency. Hence, in order to minimize reductions in circuit performance, the MOSFET threshold voltages ($V_{TH}$) are reduced so as to minimize reductions in the MOSFET current. (Further discussion of the relationship(s) between power supply voltage, threshold voltage, and operating performances for MOSFET's can be found in commonly assigned, copending U.S. patent application Ser. No. 08/292,513, filed Aug. 18, 1994, and entitled "Low Power, High Performance Junction Transistor"; the disclosures of which are hereby incorporated by reference.) However, this in turn has the effect of increasing MOSFET leakage current, i.e., MOSFET current flowing when the device is off.

The Applicant believes that if the write driver circuit of FIG. 2 was constructed with the low powered, low threshold transistors discussed in the above referenced copending application, leakage current in the write line pass transistors 30 and 32 of a write driver circuit 22 would adversely affect the operation of the circuit by inducing a read operation failure due to corruption of the bit line voltage levels.

SUMMARY OF THE INVENTION

The present invention relates to a circuit for reducing current leakage in a logic circuit such as a write driver circuit in a memory array. The current leakage reducing circuit includes a data line configured to be set to a predetermined voltage, a data drive circuit, and an enable circuit. The enable circuit is coupled to the data line and the data drive circuit, and is configured to enable the data line to accept a data value from the data drive circuit. The invention also includes current leakage prevention circuit, coupled to the enable circuit, and configured to substantially reduce leakage from the data line through the enable circuit when the enable circuit is not enabled.

DESCRIPTION OF THE DRAWINGS

The objects, features and advantages of the system of the present invention will be apparent from the following description in which.

DESCRIPTION OF THE PREFERRED EMBODIMENT

Figure 1:
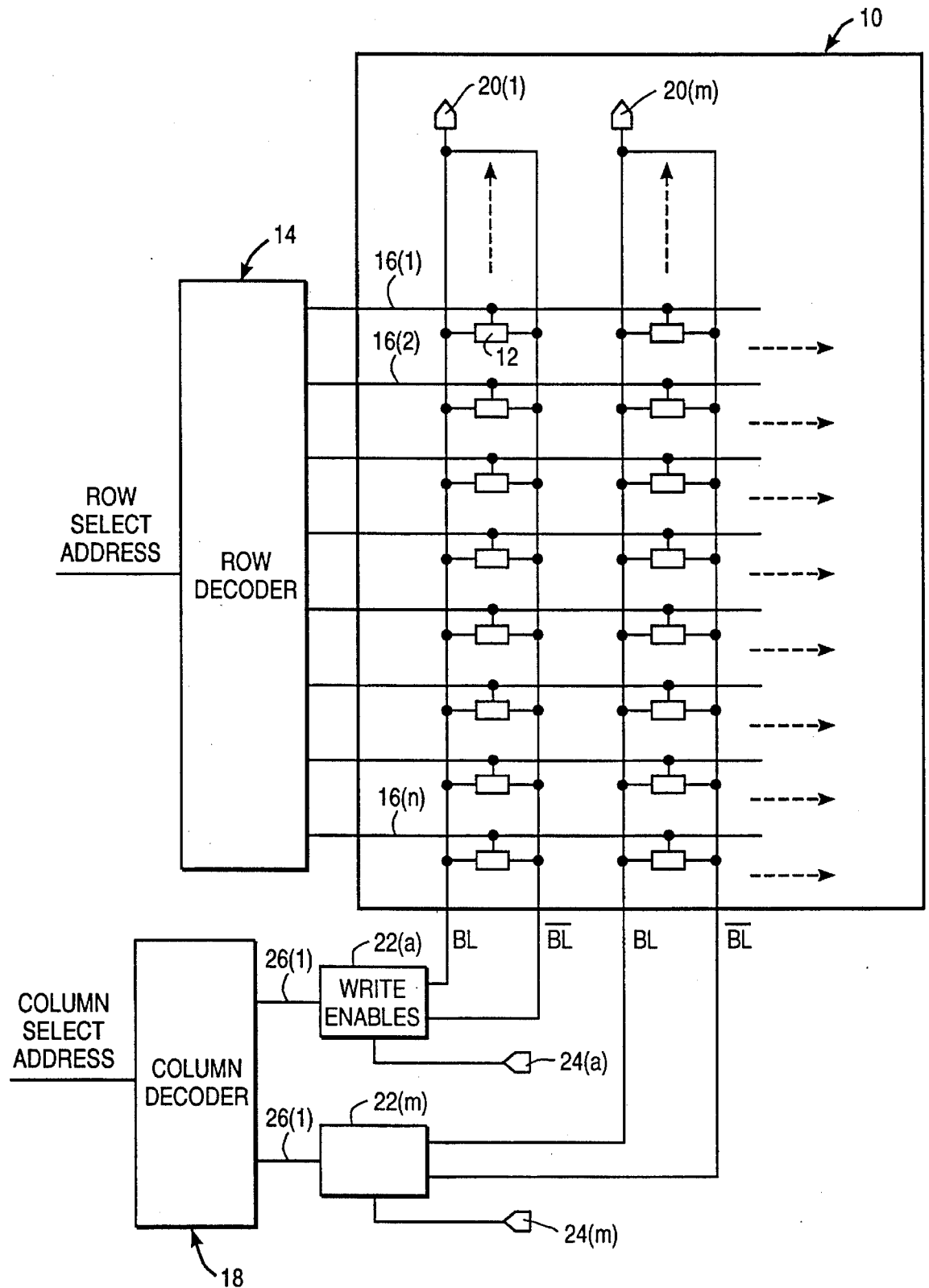
FIG. 1 illustrates a prior art SRAM memory array.
Figure 2:
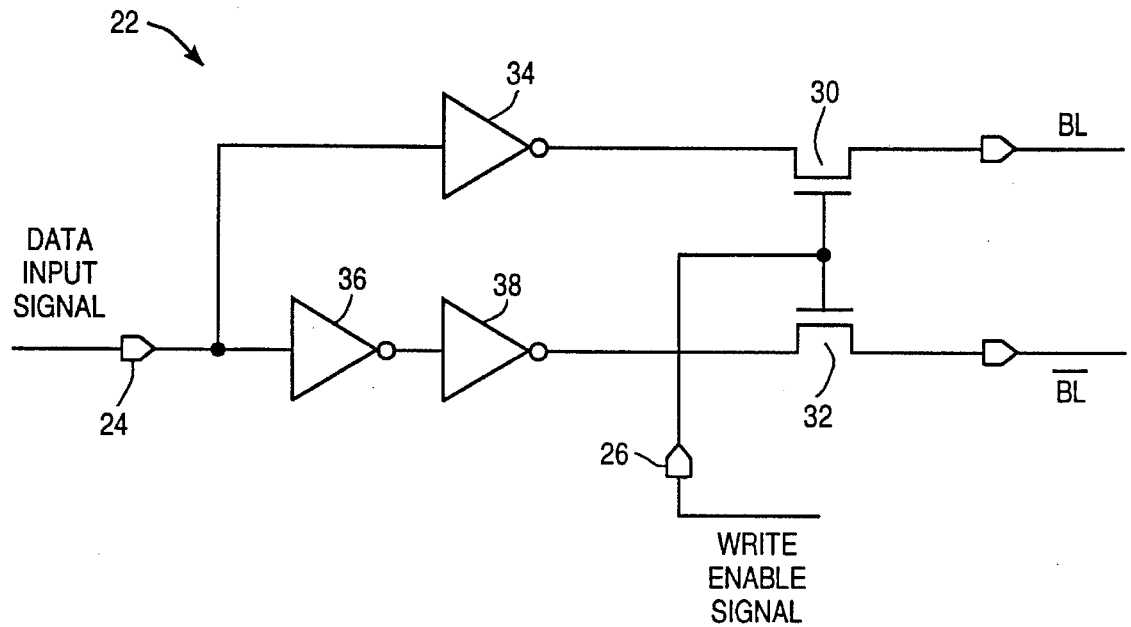
FIG. 2 illustrates a prior art logic diagram of a write driver circuit.
Figure 3:
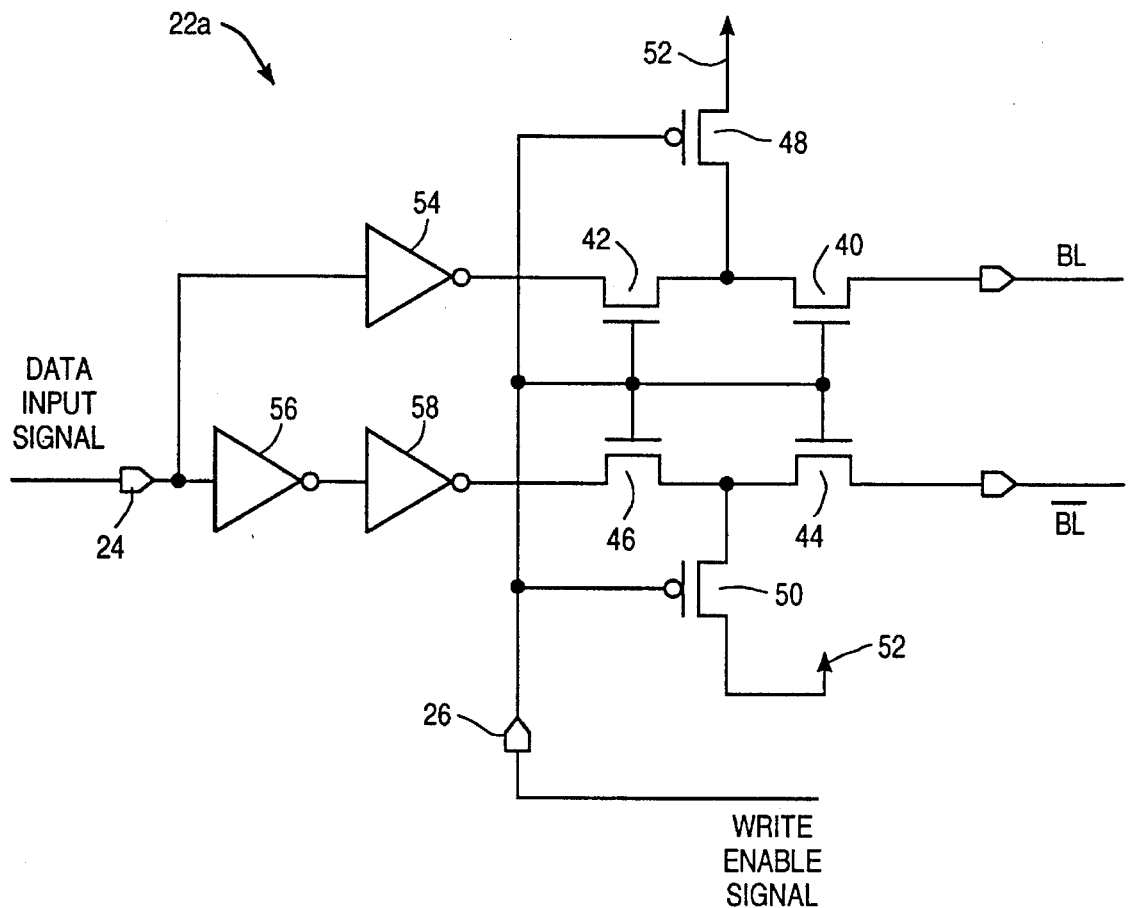
FIG. 3 illustrates a logic diagram of write driver circuit according to one embodiment of the invention.

Referring to FIG. 3, a logic diagram of a write driver circuit 22a according to one embodiment of the invention is shown. The write driver circuit 22a includes an enable input 26 for receiving the write enable signal; four n-channel write line pass transistors 40, 42, 44, and 46, two p-channel pull up transistors 48 and 50, a reference voltage 52, three inverters 54, 56 and 58, and a data input 24 for receiving the data input signal. The enable input 26 is coupled to the gates of transistors 40, 42, 44, and 46 and to the gates of transistors 48 and 50. The source of transistor 40 is coupled to the drain of transistor 42 and the drain of transistor 40 is coupled to the bit line BL. The source of transistor 42 is coupled to the output of inverter 54. The input of inverter 54 is coupled to receive the data input signal provided at the data input 24. The source of transistor 48 is coupled to the drain of transistor 42 and the drain of transistor 48 is coupled to the reference voltage 52. The source of transistor 44 is coupled to the drain of transistor 46 and the drain of transistor 44 is coupled to the bit line $\overline{BL}$. The source of transistor 46 is coupled to the output of inverter 58. The input of inverter 58 is coupled to the output of inverter 56. The input of inverter 56 is coupled to receive the data input signal provided at the data input 24. The source of transistor 50 is coupled to the drain of transistor 46 and the drain of transistor 50 is coupled to the reference voltage 52.

The write driver circuit 22a has two states, inactive and write. During the inactive state, the write enable signal 26 is low. As a result, low potential is applied to the gates of transistors 40, 42, 44, and 46, causing them to be off. Transistors 48 and 50, however, are turned on, coupling the drains of transistors 42 and 46 to the reference voltage 52. In one embodiment, the reference voltage 52 is set at Vdd. Thus, the sources of transistors 40 and 44 are pulled to the reference voltage 52. As a result, transistors 40 and 44 are reversed biased off, minimizing the amount of leakage current through these transistors. Furthermore, since the bit lines BL and $\overline{BL}$ are also precharged high, the transistors 40 and 44 are also reversed biased off on the drain side of these transistors. Note that there may be an increase in current leakage through transistors 42 and 46 because the pull up operation causes an increased source to drain voltage of one of these transistors. However, this current leakage is of minor consequence because lost charge will be replenished by current passing through transistors 48 and 50 from reference voltage 52.

During a write operation, the bit lines BL and $\overline{BL}$ are precharged. The write enable signal then transitions high causing the transistors 40, 42, 44, and 46 to turn on. The bit lines BL and $\overline{BL}$ are therefore coupled to the output of inverter 54 and 58 respectively. In addition, the transistors 48 and 50 turn off. The bit lines BL and $\overline{BL}$ can therefore be moved, depending on the state of the data input. If the data input signal received at the data input 24 is high, the output of inverter 54 is low, causing the bit line BL to be pulled low through the inverter 54. On the other hand, the output of inverter 58 is high when the data input signal is high, causing the bit line $\overline{BL}$ to remain high. The complement of the above applies when the data input signal received at the data input 24 is low.

Figure 4:
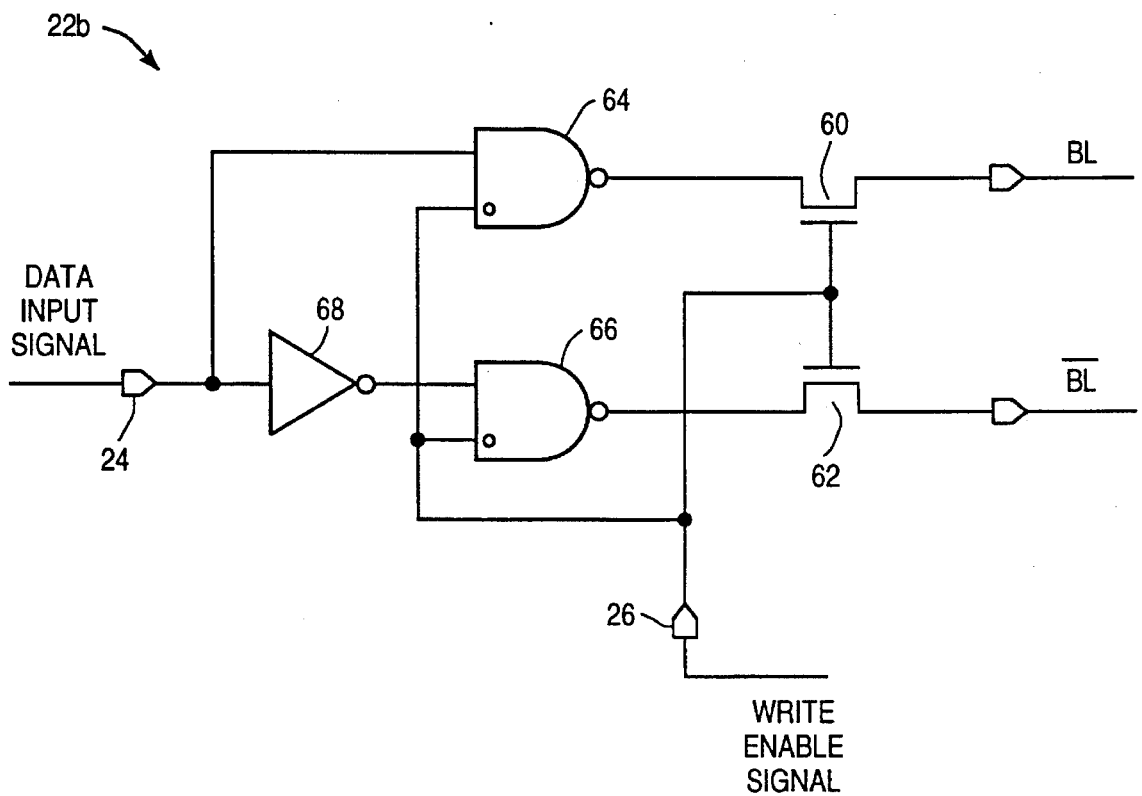
FIG. 4 illustrates a logic diagram of a write driver circuit configured with NAND gates according to one embodiment of the invention.

Referring to FIG. 4, a logic diagram of a write driver circuit 22b configured with NAND gates according to another embodiment of the invention is shown. The write driver circuit 22b includes an enable input 26 for receiving the write enable signal, two n-channel write line pass transistors 60 and 62, two NAND gates 64 and 66, an inverter 68, and a data input 24 for receiving the data input signal. The enable input 26 is coupled to the gates of transistors 60 and 62. The source of the transistor 60 is coupled to the output of NAND gate 64 and the drain is coupled to the bit line BL. One of the inputs of NAND gate 64 is coupled to the data input 24 to receive the data input signal and the other input is coupled to the enable input 26 to receive the write enable signal. The source of transistor 62 is coupled to the output of NAND gate 66 and the drain is coupled to the bit line $\overline{BL}$. One of the inputs of NAND gate 66 is coupled to the output of inverter 68 and the other input is coupled to the enable input 26 to receive the write enable signal. The input of inverter 68 is coupled to the data input 24 to receive the data input signal.

During the inactive state, the write enable signal is low which causes transistors 60 and 62 to be off and causes a low signal to be provided at the write input of each of the NAND gates 64 and 66. This causes the output of NAND gates 64 and 66 to be high since the output of a NAND gate will always be high unless both of its inputs are high. A negative gate to source voltage is therefore applied to transistors 60 and 62, reverse biasing both transistors 60 and 62 off. As a result, leakage current through transistors 60 and 62 is substantially reduced. Also, if the bit lines BL and $\overline{BL}$ are precharged high, the transistors 60 and 62 are also reversed biased off on the drain side of these transistors.

During a write operation, the bit lines BL and $\overline{BL}$ are precharged. The write enable signal then transitions high, causing the transistors 60 and 62 to turn on, coupling the bit lines BL and to the output of NAND gates 64 and 66 respectively. The high write enable signal causes one input at each NAND gate 64 and 66 to transition high. Accordingly, when the data input signal from data input 24 arrives, the second input to one of either NAND gates 64 or 66 transitions high, depending on the value of the data input signal. For example, if the data input signal is high, the second input into NAND gate 64 is also high. The NAND gate 64 therefore produces a low output because both of its inputs are high and the bit line BL discharges low. On the other hand, when the data input signal is high the input of inverter 68 is high, causing the second input into NAND gate 66 to be low. As a result, the output of NAND gate 66 remains high. Thus, the bit line $\overline{BL}$ remains high. The complement of the above applies when the data input signal received at the data input 24 is low.

The present invention may also be used in DRAM devices. In DRAMs, the only one bit in per column is typically used. Consequently, a complementary circuits is not required to reverse-bias the write line pass transistor coupled to the bit line $\overline{BL}$.

Although the present invention has been described in the context of a memory array, it should be noted that the present invention may be used to reduce current leakage from any logic circuit having a data line that is preset to a predetermined voltage during an inactive state of the logic circuit.

While the invention has been described in relation to the preferred embodiments shown in the accompanying figures, other alternatives, embodiments and modifications will be apparent to those skilled in the art. It is intended that the specification be only exemplary, and that the true scope and spirit of the invention be indicated by the following claims.

What is claimed is:

1. A circuit for reducing current leakage, comprising:

a data line configured to be set to a predetermined voltage;

a data drive circuit;

an enable circuit, coupled to the data line and the data drive circuit, and configured to enable the data line to accept a data value from the data drive circuit; and a current leakage prevention circuit, coupled to the enable circuit, and configured to substantially reduce leakage from the data line through the enable circuit when the enable circuit is not enabled.

2. The circuit of claim 1, wherein the data line is a bit line in a memory array.

3. The circuit of claim 2, wherein the memory array is a random access memory.

4. The circuit of claim 3, wherein the memory array is a dynamic random access memory array.

5. The circuit of claim 3, wherein the memory array is a static random access memory array.

6. The circuit of claim 2, wherein the data line is precharged to the predetermined voltage prior to a write operation of a memory cell in the memory array.

7. The circuit of claim 2, wherein the enable circuit is enabled during a write operation of a memory cell in the memory array by an enable signal.

8. The circuit of claim 7, wherein the current leakage prevention circuit is disabled during a write operation.

9. The circuit of claim 5, further comprising:

a complementary data line configured to be set to the predetermined voltage;

a complementary data drive circuit;

a complementary enable circuit, coupled to the complementary data line and the complementary data drive circuit, and configured to enable the complementary data line to accept a complementary data value from the complementary data drive circuit; and a complementary current leakage prevention circuit, coupled to the complementary enable circuit, and configured to substantially reduce leakage from the complementary data line through the complementary enable circuit when the complementary enable circuit is not enabled.

10. The circuit of claim 1, wherein the enable circuit is a pass transistor.

11. The circuit of claim 10, wherein the pass transistor includes a control electrode coupled to receive an enable signal, a first electrode coupled to the data line, and a third electrode coupled to the data drive circuit.

12. The circuit of claim 11, wherein the current prevention leakage circuit maintains the pass transistor in a substantially negative gate-source state when the enable circuit is not enabled, thereby substantially reducing leakage current from or to the data line when the enable circuit is not enabled.

13. The circuit of claim 1, wherein the current prevention leakage circuit includes a first transistor.

14. The circuit of claim 13, wherein the first transistor includes a control element coupled to receive an enable signal, a first electrode coupled to the enable circuit, and a second electrode coupled to a reference voltage.

15. The circuit of claim 14, wherein the enable circuit is a pass transistor and the first transistor and the pass transistor are complements.

16. The circuit of claim 15, wherein the pass transistor is a N-channel transistor and the second transistor is a P-channel transistor.

17. The circuit of claim 16, wherein the current prevention leakage circuit maintains the pass transistor in a state where the gate-source voltage is substantially negative when the enable circuit is not enabled.

18. The circuit of claim 1, wherein the data drive circuit comprises an inverter coupled to receive the data value.

19. The circuit of claim 1, wherein the data drive circuit is a logic gate coupled to receive the data value and an enable signal.

20. The circuit of claim 19, wherein the logic gate is a NAND gate coupled to receive the data value and an enable signal.

21. The circuit of claim 1, wherein the data line, the data drive circuit, the enable circuit, and the current leakage prevention circuit are contained on a semiconductor chip.

22. The circuit of claim 21, wherein the semiconductor chip is contained in a computer.

23. The circuit of claim 1, wherein the data line is a data line for receiving the data value in a logic circuit.

24. A method of providing a circuit for reducing current leakage, the method comprising to steps of:

providing a data line configured to be set to a predetermined voltage;

providing a data drive circuit;

providing an enable circuit, coupled to the data line and the data drive circuit, and configured to enable the data line to accept a data value from the data drive circuit; and providing a current leakage prevention circuit, coupled to the enable circuit, and configured to substantially reduce leakage from the data line through the enable circuit when the enable circuit is not enabled.

25. A method of operating a circuit for reducing current leakage, the method comprising to steps of:

setting a data line configured to be set to a predetermined voltage;

maintaining a transistor coupled between the data line and a data drive circuit in a substantially reversed-biased state when the data drive circuit is not driving the data line; and activating the transistor when the data drive circuit is driving the data line.

\* \* \* \* \*